United States Patent
Yang et al.

(10) Patent No.: US 12,085,627 B2
(45) Date of Patent: Sep. 10, 2024

(54) TEST APPARATUS AND METHOD FOR TESTING CABLE ASSEMBLY

(71) Applicants: Tyco Electronics (Suzhou) Ltd., Suzhou (CN); Tyco Electronics Technology (SIP) Ltd., Suzhou (CN); Tyco Electronics (Shanghai) Co., Ltd., Shanghai (CN)

(72) Inventors: An (Joshua) Yang, Shanghai (CN); Lvhai (Samuel) Hu, Shanghai (CN); Haomai (Ivan) Yin, Shanghai (CN); Xuexiong (Ricky) Jiang, Suzhou (CN); Jian Chen, Suzhou (CN); Jinxian (Tony) Wang, Suzhou (CN)

(73) Assignees: Tyco Electronics (Shanghai) Co., Ltd., Shanghai (CN); Tyco Electronics (Suzhou) Ltd., Suzhou (CN); Tyco Electronics Technology (SIP) ltd., Suzhou (CN)

( * ) Notice: Subject to any disclaimer, the term of this patent is extended or adjusted under 35 U.S.C. 154(b) by 0 days.

(21) Appl. No.: 17/732,908

(22) Filed: Apr. 29, 2022

(65) Prior Publication Data

US 2022/0349956 A1    Nov. 3, 2022

(30) Foreign Application Priority Data

Apr. 30, 2021   (CN) .................. 202110488686.3

(51) Int. Cl.
*G01R 31/59*   (2020.01)
*G01R 31/08*   (2020.01)
*G01R 31/12*   (2020.01)

(52) U.S. Cl.
CPC ............. *G01R 31/59* (2020.01); *G01R 31/08* (2013.01); *G01R 31/1272* (2013.01)

(58) Field of Classification Search
CPC .... G01R 31/59; G01R 31/08; G01R 31/1272; G01R 31/58
See application file for complete search history.

(56) References Cited

U.S. PATENT DOCUMENTS

| | | | | |
|---|---|---|---|---|
| 6,365,835 B1 * | 4/2002 | Farmer | ................... | H01B 7/365 |
| | | | | 174/112 |
| 2013/0241571 A1 * | 9/2013 | Oiwa | ..................... | G01R 31/58 |
| | | | | 324/543 |

FOREIGN PATENT DOCUMENTS

| | | | | |
|---|---|---|---|---|
| CN | 111693227 A | * | 9/2020 | ............. G01M 3/26 |
| CN | 111871854 A | * | 11/2020 | ............. B07C 5/34 |
| CN | 111999003 A | * | 11/2020 | ............. G01M 3/04 |
| JP | 4586059 B2 | * | 11/2010 | |

* cited by examiner

*Primary Examiner* — Feba Pothen
(74) *Attorney, Agent, or Firm* — Barley Snyder

(57) ABSTRACT

A test apparatus for testing a cable assembly includes a first air tightness tester, a second air tightness tester and an electrical tester. A first test device is operably connected to the first air tightness tester and the electrical tester, and a second test device is operably connected to the second air tightness tester and the electrical tester. With a first cable connector and a second cable connector of a cable installed on a respective one of the first test device and the second test device, an air tightness test and an electrical test are performed on the first cable connector and the second cable connector simultaneously.

27 Claims, 7 Drawing Sheets

TEST APPARATUS AND METHOD FOR TESTING CABLE ASSEMBLY

CROSS-REFERENCE TO RELATED APPLICATIONS

This application claims the benefit of Chinese Patent Application No. CN202110488686.3 filed on Apr. 30, 2021 in the State Intellectual Property Office of China, the whole disclosure of which is incorporated herein by reference.

FIELD OF THE INVENTION

The invention relates to the technical field of testing cables, in particular to a test apparatus and a test method for testing a cable assembly.

BACKGROUND

After a cable and a cable connector are assembled into a cable assembly, the cable assembly must be tested on-line at the cable end. During this test, air tightness test, conduction test and high voltage test shall be performed on the cable assembly to judge whether the performance of the cable assembly is qualified. Usually, two equipments are used for this test, that is, one equipment is used for conduction test and high voltage test (both are also referred to as electrical test), and the other equipment is used for air tightness test. The operator needs to load the cable assembly onto the two equipments in turn to perform the electrical test and the air tightness test respectively, which not only consumes time, but also increases the test cost.

SUMMARY

According to an embodiment of the present disclosure, a test apparatus for testing a cable assembly includes a first air tightness tester, a second air tightness tester and an electrical tester. A first test device is operably connected to the first air tightness tester and the electrical tester, and a second test device is operably connected to the second air tightness tester and the electrical tester. With a first cable connector and a second cable connector of a cable installed on a respective one of the first test device and the second test device, an air tightness test and an electrical test are performed on the first cable connector and the second cable connector simultaneously.

BRIEF DESCRIPTION OF THE DRAWINGS

The invention will now be described by way of example with reference to the accompanying Figures, of which.

DETAILED DESCRIPTION OF THE EMBODIMENTS

Figure 1:
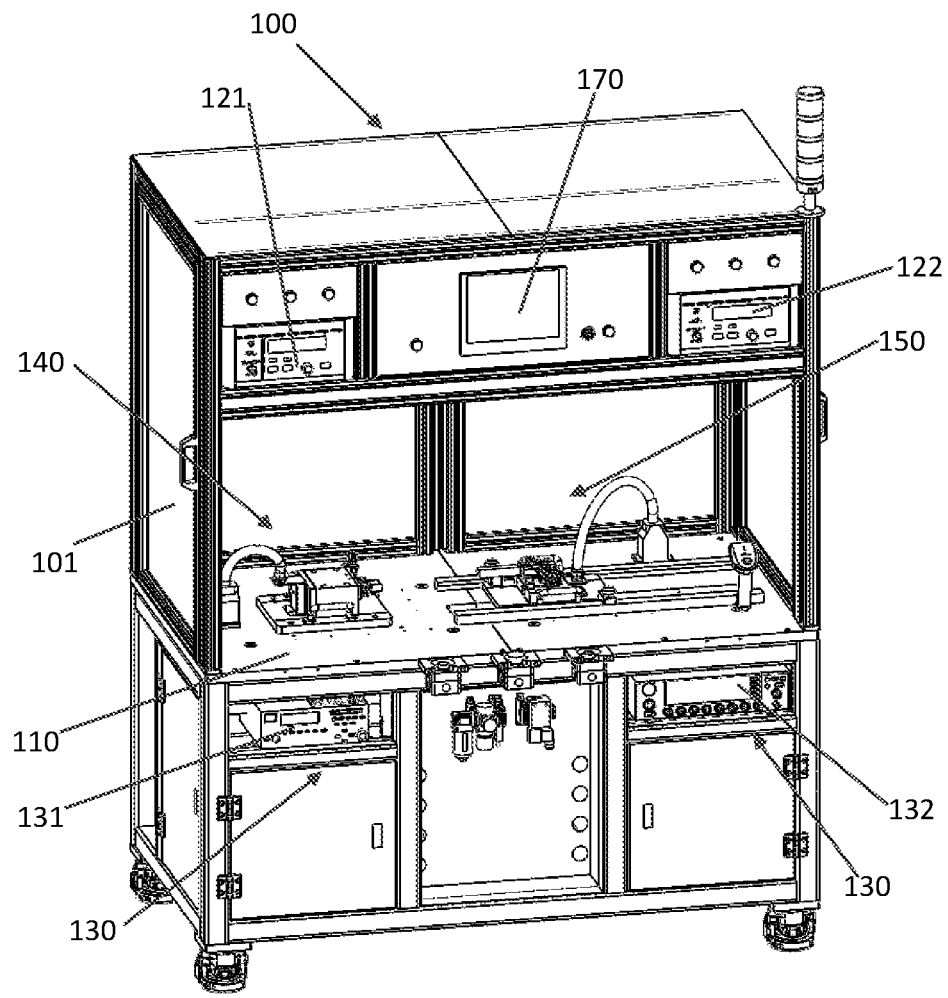
FIG. 1 is a perspective view of a test apparatus for testing a cable assembly according to an embodiment of the present invention.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to a general concept of the present invention, there is provided a test apparatus for testing a cable assembly, the cable assembly includes a cable and a first cable connector and a second cable connector respectively installed at both ends of the cable. The test apparatus comprises of: a test bench; a first air tightness tester, a second air tightness tester and an electrical tester; and a first test device and a second test device installed on the test bench. The first test device is operably connected to the first air tightness tester and the electrical tester, and the second test device is operably connected to the second air tightness tester and the electrical tester. When the first cable connector and the second cable connector are respectively installed on the first test device and the second test device, an air tightness test and an electrical test are capable of being performed on the first cable connector and the second cable connector at the same time.

Figure 2:
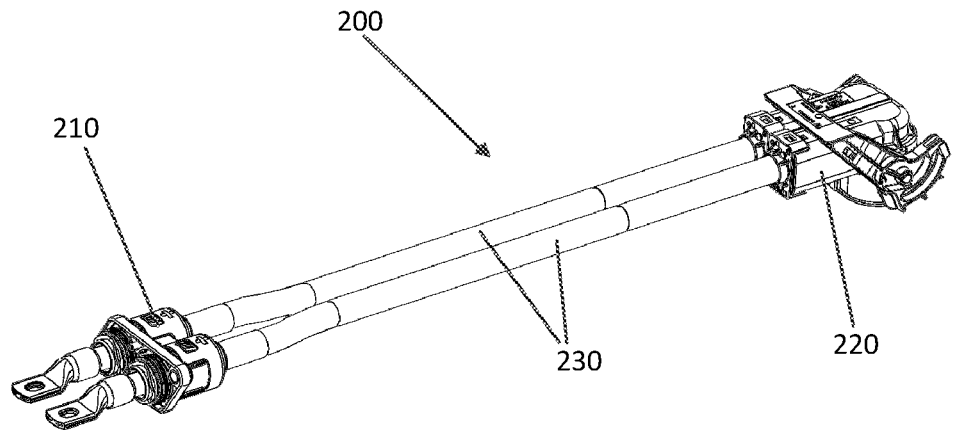
FIG. 2 is a perspective view of a cable assembly tested by the test apparatus shown in FIG. 1.

FIG. 1 shows a test apparatus 100 for testing a cable assembly 200. FIG. 2 shows the cable assembly 200. The cable assembly 200 includes a cable 230 and a first cable connector 210 and a second cable connector 220 installed at both ends of the cable 230 respectively. The appropriate type of first cable connector 210 and/or second cable connector 220 can be selected according to the purpose of the cable assembly 200.

In order to facilitate the description of the internal structure of the test apparatus 100, FIG. 1 shows the test apparatus 100 with a door 101 open. Referring to FIG. 1, the test apparatus 100 includes: a human-computer interaction interface 170 that facilitates the operator to operate the test apparatus 100; a first air tightness tester 121 and a second air tightness tester 122 respectively located on both sides of the human-computer interaction interface 170; a test bench 110 located below the human-computer interaction interface 170; a start button 180 and an emergency stop button 190 (see FIG. 3) located below the test bench 110, the start button 180 is used to start the test apparatus 100, and the emergency stop button 190 is used to stop the test apparatus 100 in an emergency; a conduction tester 131 and a high-voltage tester 132 (collectively referred to as an electrical tester 130) located on both sides of the start button 180 and the emergency stop button 190, the conduction tester 131 is used to test the conduction state of the cable assembly 200, and the high-voltage tester 132 is used to test the high-voltage performance of the cable assembly 200; and a first test device 140 and a second test device 150 mounted on the test bench 110.

The first test device 140 is operably connected to the first air tightness tester 121 and the electrical tester 130, and the second test device 150 is operably connected to the second air tightness tester 122 and the electrical tester 130. As a result, when the first cable connector 210 and the second cable connector 220 are installed on the first test device 140 and the second test device 150 respectively, an air tightness test and an electrical test can be performed on the first cable connector 210 and the second cable connector 220 at the same time.

Therefore, the operator only needs to load the cable assembly 200 onto one test apparatus 100 to complete the air tightness test and electrical test, and does not need to unload the cable assembly 200 from one test apparatus and load the cable assembly 200 onto another test apparatus again. Thus, the test efficiency of the cable assembly 200 is greatly improved and the test cost of the cable assembly 200 is reduced.

Figure 3:
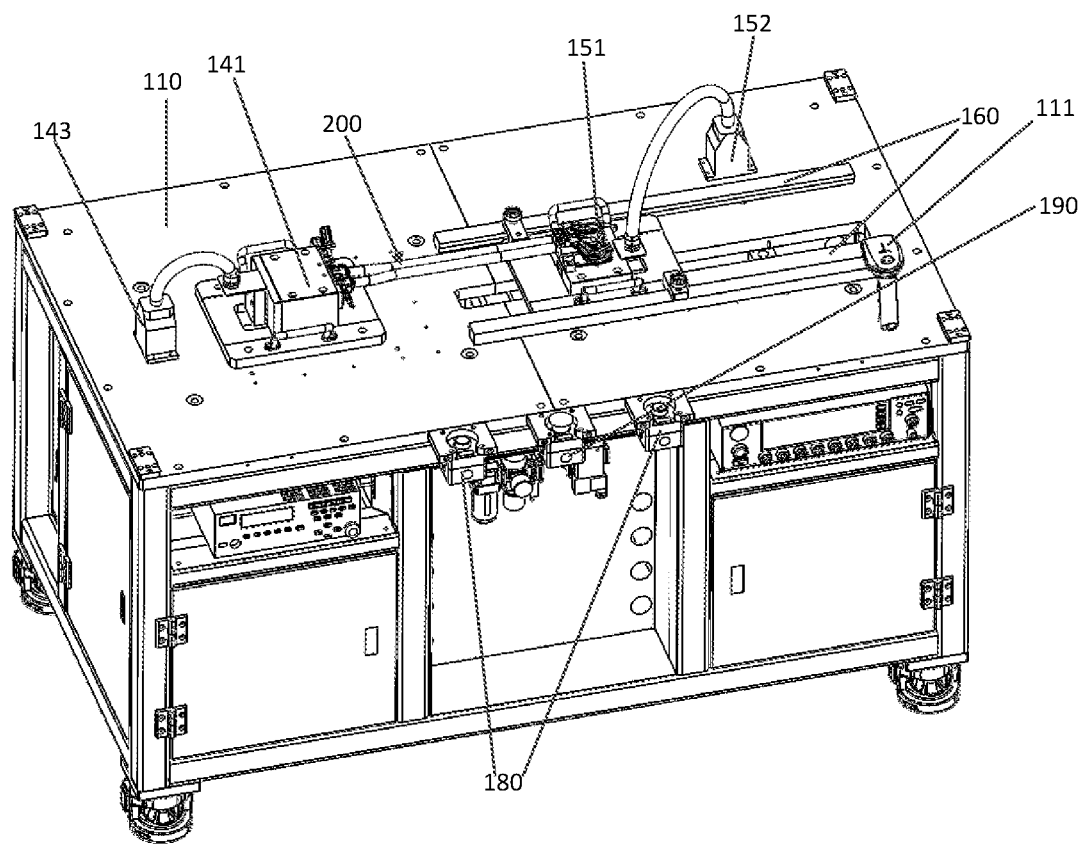
FIG. 3 is a perspective view of a part of the test apparatus shown in FIG. 1.
Figure 4:
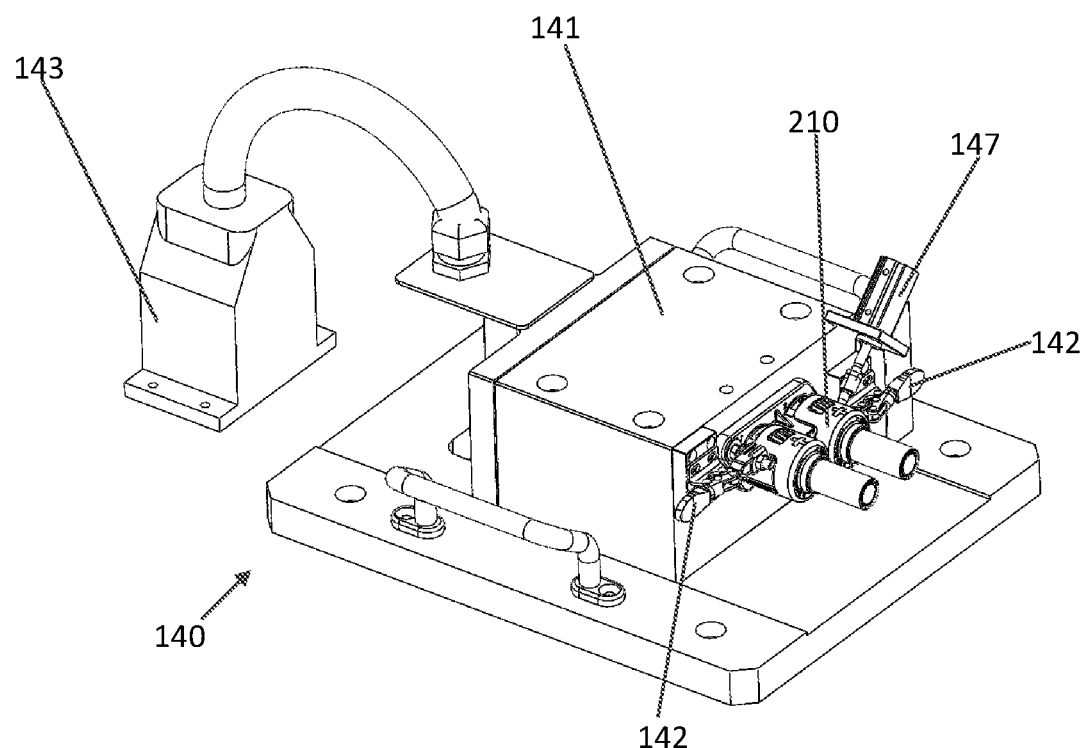
FIG. 4 is a perspective view of a first test device installed in the test apparatus shown in FIG. 1.

Referring to FIGS. 3 and 4, the first test device 140 includes a first mating connector 141, a damper 142 and a first quick connector 143. The first mating connector 141 is fixedly mounted on the test bench 110, and the first cable connector 210 is partially inserted into the first mating connector 141. The damper 142 is arranged on the first mating connector 141 for clamping the first cable connector 210 to the first mating connector 141 to fix the first cable connector 210. The first quick connector 143 is connected to the first mating connector 141 by a cable. an electric wire and a vacuum tube travel through the cable for simultaneously connecting the first cable connector 210 to a power supply and a vacuum source (not shown) of the test apparatus 100, the first air tightness tester 121 and the electrical tester 130. The type of the first test device 140 installed in the test apparatus 100 can be selected according to the type of the first cable connector 210, and the first quick connector 143 enables the operator to quickly disassemble and assemble the first test device 140 so that the test apparatus 100 can measure various types of sensor components, thereby greatly improving the applicability and practicability of the test apparatus 100.

Figure 5:
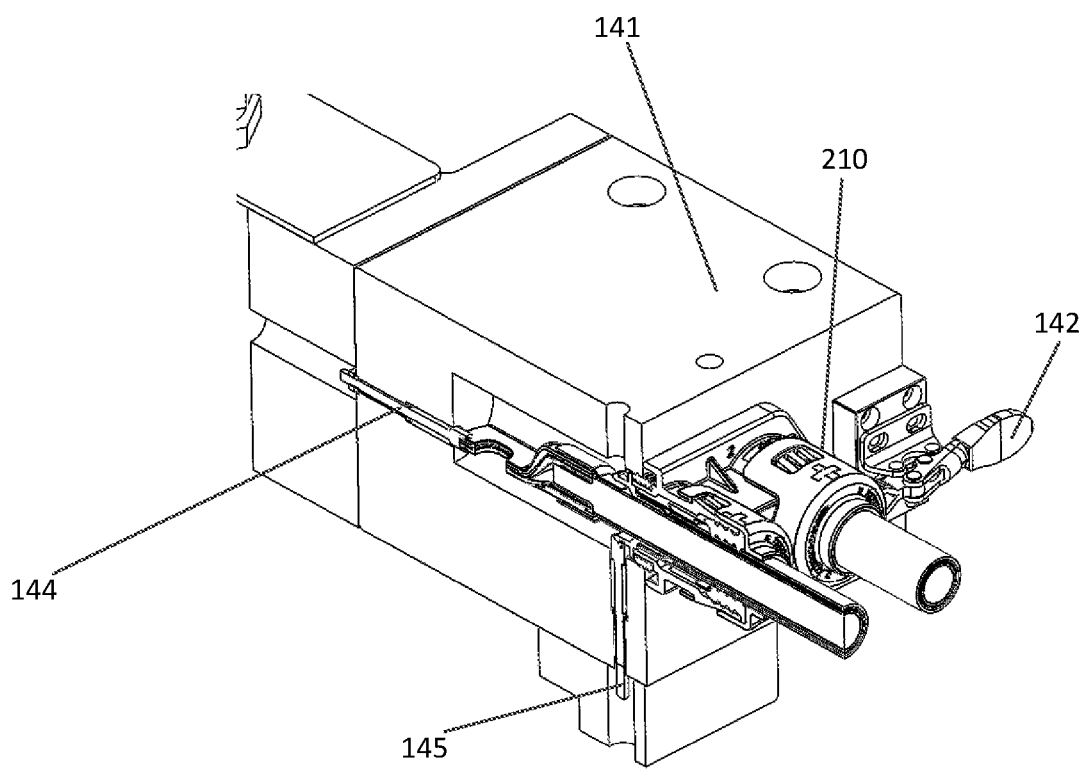
FIG. 5 is a sectional view of the first mating connector of the first test device shown in FIG. 4.

Referring to FIG. 5, the first test device 140 also includes a first center contact probe 144 and a first shielding layer probe 145 respectively connected to the electrical tester 130. The first center contact probe 144 is in electrical contact with the connection terminal of the first cable connector 210 inserted into the first mating connector 141 in the longitudinal direction to detect the conduction signal of the first cable connector 210. In the first mating connector 141, the first shielding layer probe 145 is in electrical contact with the shielding layer inserted into the first mating connector 141 of the first cable connector 210 in a transverse direction to detect the shielding signal of the first cable connector 210. The operator judges the electrical performance of the first cable connector 210 according to the conduction signal and shielding signal of the first cable connector 210.

Figure 6:
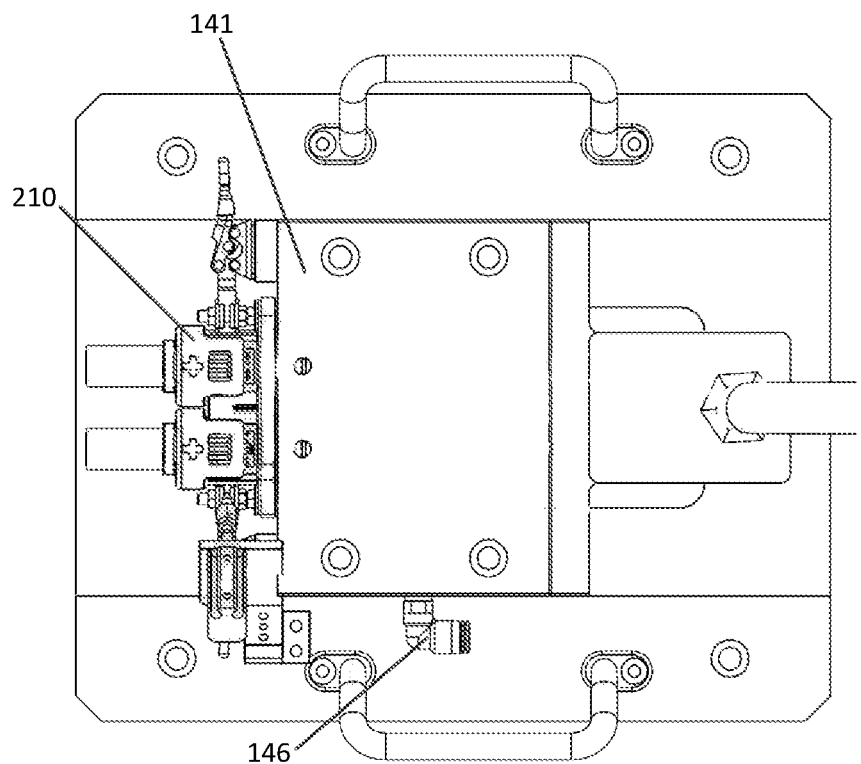
FIG. 6 is a top view of the first mating connector shown in FIG. 4.

Referring to FIG. 6, the first test device 140 further includes a first air tightness connector 146 at least partially arranged in the first mating connector 141, which is configured as a vacuum tube for connecting the first cable connector 210 to the first air tightness tester 121. It enables the first air tightness tester 121 to test the air tightness or vacuum degree of the first cable connector 210 via the first air tightness connector 146.

The arrangement of the probes 144, 145 and the air tightness connector 146 enables the first test device 140 to perform electrical test and air tightness test on the first cable connector 210 at the same time.

Referring to FIG. 4, the marker 147 in the first test device 140 is provided on the first mating connector 141 to mark the first cable connector 210 of the qualified cable assembly 200 after the cable assembly 200 or the first cable connector 210 is tested to be qualified, so that the qualified cable assembly 200 can be marked in time to distinguish from the untested or unqualified cable assembly.

Figure 7:
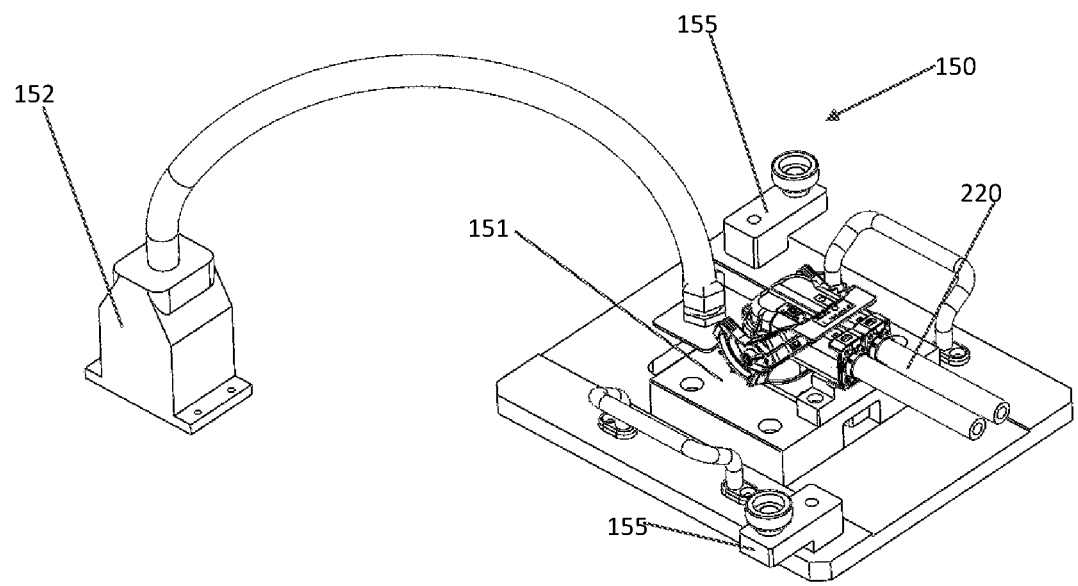
FIG. 7 is a perspective view of a second test device installed in the test apparatus shown in FIG. 1.

The second test device 150, which includes a second mating connector 151 and a second quick connector 152, is described in further detail below with reference to FIGS. 7 to 8. The second mating connector 151 is movably mounted on the guide rail 160 arranged on the test bench 110, so that the position of the second mating connector 151 and the distance between the first test device 140 and the second test device 150 can be easily adjusted, which facilitates the installation of cable assemblies 200 of different lengths between the first test device 140 and the second test device 150. In order to fix the second mating connector 151, the second test device 150 also includes a locking bolt 155 provided on the second mating connector 151. The locking bolt 155 is used to fix the second mating connector 151 at a suitable position on the guide rail 160. A monitor 111 is also provided next to the guide rail 160 to accurately observe the position of the second mating connector 151 on the guide rail 160.

The second cable connector 220 is plugged into the detection port 153 (see FIG. 8) of the second mating connector 151. The second quick connector 152 is connected to the second mating connector 151 for simultaneously connecting the second cable connector 220 to a power supply and a vacuum source (not shown) of the test apparatus 100, a second air tightness tester 122 and an electrical tester 130. Similar to the first quick connector 143, the second quick connector 152 enables the operator to quickly disassemble and assemble the second test device 150, which is convenient to select the type of the second test device 150 according to the type of the second cable connector 220, and greatly improves the applicability and practicability of the test apparatus 100.

Figure 8:
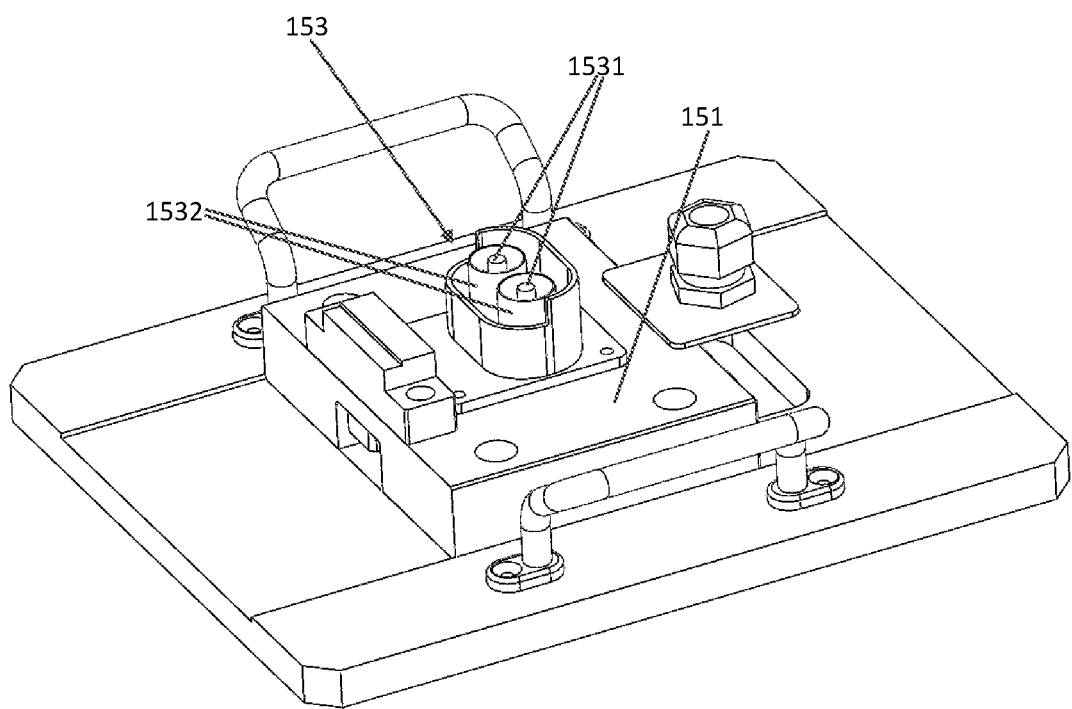
FIG. 8 is a perspective view of a second mating connector of the second test device shown in FIG. 7.

Referring to FIG. 8, the detection port 153 includes a second center contact probe 1531 and a second shielding layer probe 1532. The second center contact probe 1531 extending in the vertical direction is used for electrical contact with the connection terminal of the second cable connector 220, so as to detect the conduction signal of the second cable connector 220. The second shielding layer probe 1532 is configured in a cylindrical shape and accommodates the second center contact probe 1531 therein. The second shielding layer probe 1532 is used for electrical contact with the shielding layer for shielding noise signals of the second cable connector 220, so as to detect the shielding signals of the second cable connector 220. The operator judges the electrical performance of the second cable connector 220 according to the conduction signal and shielding signal of the second cable connector 220.

The second test device 150 also includes a second air tight connector (not shown in the figure) arranged in the second mating connector 151, which is completely formed in the second mating connector 151 and is configured as a vacuum tube for connecting the second cable connector 220 to the second air tightness tester 122. It enables the second air tightness tester 122 to test the air tightness or vacuum degree of the first cable connector 210 via the second air tightness connector.

Similar to the first test device 140, the probes 1531, 1532 and the second air tightness connector are arranged so that the second test device 150 can perform electrical test and air tightness test on the second cable connector 220 at the same time.

The operator can use the test apparatus 100 to test the cable assembly 200 according to the following steps of:

installing the first cable connector 210 and the second cable connector 220 of the cable assembly 200 to be tested on the first mating connector 141 of the first test device 140 and the second mating connector 151 of the second test device 150, respectively;

clamping the first cable connector 210 on the first mating connector 141 by the damper 142, and fixing the second mating connector 151 at a suitable position on the guide rail 160 by the locking bolt 155;

pressing the start button 180 to start the test apparatus 100 to simultaneously perform air tightness test and electrical test on the cable assembly 200; and after the test, marking the first cable connector 210 of the qualified cable assembly 200 by the marker 147, and reporting the information of the unqualified cable assembly 200.

The above describes the test apparatus 100 with only two test devices 140 and 150 as examples. However, this is not restrictive. More similar test devices can also be used in the test apparatus 100 to measure more than two cable connectors at the same time, so as to further improve the working efficiency of the test apparatus 100.

In addition, those areas in which it is believed that those of ordinary skill in the art are familiar, have not been described herein in order not to unnecessarily obscure the invention described. Accordingly, it has to be understood that the invention is not to be limited by the specific illustrative embodiments, but only by the scope of the appended claims.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of the elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A cable assembly test apparatus comprising:
   a human-computer interaction interface;
   a first air tightness tester and a second air tightness tester positioned adjacent to the human-computer interaction interface;
   a test bench positioned below the human-computer interaction interface;
   an electrical tester; and
   a first test device including a first mating connector fixedly installed on the test bench, and a second test device installed on the test bench and including a second mating connector movably installed on the test bench, the first test device is operably connected to the first air tightness tester and the electrical tester, and the second test device is operably connected to the second air tightness tester and the electrical tester, wherein when a first cable connector and a second cable connector of a cable are respectively installed on the first test device and the second test device, an air tightness test and an electrical test are performed on the first cable connector and the second cable connector at the same time, wherein the first cable connector is engaged with the first mating connector, and the second cable connector is engaged with a detection port of the second mating connector.

2. The test apparatus according to claim 1, wherein the first test device further includes:
   a clamp provided on the first mating connector for clamping the first cable connector to the first mating connector; and
   a first quick connector connected to the first mating connector for connecting the first cable connector to the first air tightness tester and the electrical tester at the same time.

3. The test apparatus according to claim 1, wherein the first test device further comprises:
   a first center contact probe configured to electrically contact a connection terminal of the first cable connector inserted into the first mating connector to detect a conduction signal of the first cable connector; and
   a first shielding layer probe configured to electrically contact a shielding layer of the first cable connector inserted into the first mating connector to detect a shielding signal of the first cable connector.

4. The test apparatus according to claim 3, wherein the first test device further comprises a first air tightness connector at least partially provided in the first mating connector and configured as a vacuum tube for connecting the first cable connector to the first air tightness tester.

5. The test apparatus according to claim 1, wherein the first test device further comprises a marker provided on a first mating connector for marking the first cable connector of the qualified cable assembly after the cable assembly is tested to be qualified.

6. The test apparatus according to claim 1, wherein the second test device further includes comprises
   a second quick connector connected to the second mating connector for connecting the second cable connector to the second air tightness tester and the electrical tester.

7. The test apparatus according to claim 6, wherein the detection port comprises:
   a second center contact probe configured to electrically contact a connection terminal of the second cable connector to detect a conduction signal of the second cable connector; and a second shielding layer probe configured in a cylindrical shape to accommodate the second center contact probe therein and configured to electrically contact a shielding layer of the second cable connector to detect a shielding signal of the second cable connector.

8. The test apparatus according to claim 7, wherein the second test device further comprises a second air tight connector provided in the second mating connector and configured as a vacuum tube for connecting the second cable connector to the second air tightness tester.

9. The test apparatus according to claim 6, wherein the second test device further comprises a locking bolt provided on the second mating connector to fix the second mating connector at a suitable position on a guide rail arranged on the test bench.

10. The test apparatus according to claim 1, wherein the electrical tester comprises:
a conduction tester for testing a conduction state of the cable assembly; and
a high voltage tester for testing a high voltage performance of the cable assembly.

11. A system for testing a cable including a first cable connector fitted thereto, comprising:
an air tightness test device,
an electrical test device; and
a first test device operatively connected to the air tightness tester and including:
a first mating cable connector engaging with the first cable connector; and
a first connector connected to the first mating cable connector for connecting the first cable connector to the air tightness test device and the electrical test device simultaneously, wherein the first test device further comprises a first shielding layer probe electrically contacting a shielding layer of the first cable connector inserted into the first mating connector to detect a shielding signal of the first cable connector.

12. The system of claim 11, further comprising a second test device operatively connected to the air tightness tester and including:
a second mating cable connector engaging with a second cable connector fitted to the cable; and
a second connector connected to the second mating cable connector for connecting the second cable connector to the air tightness test device and the electrical test device simultaneously.

13. The system of claim 12, wherein the second mating connector is movably installed on a guide rail for altering its position relative to the first mating connector.

14. The system of claim 11, wherein the first test device further comprises a first center contact probe electrically contacting a connection terminal of the first cable connector inserted into the first mating connector to detect a conduction signal of the first cable connector.

15. The system of claim 11, wherein the first test device further comprises a first air tightness connector at least partially provided in the first mating cable connector and defining a vacuum tube connecting the first cable connector to the air tightness test device.

16. The system of claim 11, wherein the first test device further comprises a marker provided on the first mating cable connector for marking the first cable connector of the qualified cable assembly after the cable assembly is tested to be qualified.

17. The system of claim 12, wherein the second test device includes:
a second center contact probe electrically contacting a connection terminal of the second cable connector to detect a conduction signal of the second cable connector; and
a second shielding layer probe defining a cylindrical shape to accommodate the second center contact probe therein and electrically contacting a shielding layer of the second cable connector to detect a shielding signal of the second cable connector.

18. The system of claim 12, wherein the second test device further comprises an air tight connector provided in the second mating cable connector and defining a vacuum tube for connecting the second cable connector to the air tightness test device.

19. The system of claim 11, wherein the electrical test device includes a conduction tester and a voltage tester.

20. A cable assembly test apparatus comprising:
a test bench;
a first air tightness tester,
a second air tightness tester and an electrical tester; and
a first test device and a second test device installed on the test bench, the first test device is operably connected to the first air tightness tester and the electrical tester, and the second test device is operably connected to the second air tightness tester and the electrical tester, wherein when a first cable connector and a second cable connector of a cable are respectively installed on the first test device and the second test device, an air tightness test and an electrical test are performed on the first cable connector and the second cable connector at the same time, the first test device having:
a first mating connector fixedly installed on the test bench, wherein the first cable connector is partially inserted into the first mating connector;
a clamp provided on the first mating connector for clamping the first cable connector to the first mating connector; and
a first quick connector connected to the first mating connector for connecting the first cable connector to the first air tightness tester and the electrical tester at the same time.

21. The test apparatus according to claim 20, wherein the first test device further comprises:
a first center contact probe configured to electrically contact a connection terminal of the first cable connector inserted into the first mating connector to detect a conduction signal of the first cable connector; and
a first shielding layer probe configured to electrically contact a shielding layer of the first cable connector inserted into the first mating connector to detect a shielding signal of the first cable connector.

22. The test apparatus according to claim 21, wherein the first test device further comprises a first air tightness connector at least partially provided in the first mating connector and configured as a vacuum tube for connecting the first cable connector to the first air tightness tester.

23. The test apparatus according to claim 20, wherein the first test device further comprises a marker provided on a first mating connector for marking the first cable connector of the qualified cable assembly after the cable assembly is tested to be qualified.

24. A cable assembly test apparatus comprising:
a test bench;
a first air tightness tester,
a second air tightness tester and an electrical tester; and
a first test device and a second test device installed on the test bench, the first test device is operably connected to the first air tightness tester and the electrical tester, and the second test device is operably connected to the second air tightness tester and the electrical tester, wherein when a first cable connector and a second cable connector of a cable are respectively installed on the first test device and the second test device, an air tightness test and an electrical test are performed on the first cable connector and the second cable connector at the same time, the second test device having:
  a second mating connector movably installed on a guide rail arranged on the test bench, wherein the second cable connector is inserted into a detection port of the second mating connector; and
  a second quick connector connected to the second mating connector for connecting the second cable connector to the second air tightness tester and the electrical tester.

25. The test apparatus according to claim 24, wherein the detection port comprises:
  a second center contact probe configured to electrically contact a connection terminal of the second cable connector to detect a conduction signal of the second cable connector; and
  a second shielding layer probe configured in a cylindrical shape to accommodate the second center contact probe therein and configured to electrically contact a shielding layer of the second cable connector to detect a shielding signal of the second cable connector.

26. The test apparatus according to claim 25, wherein the second test device further comprises a second air tight connector provided in the second mating connector and configured as a vacuum tube for connecting the second cable connector to the second air tightness tester.

27. The test apparatus according to claim 24, wherein the second test device further comprises a locking bolt provided on the second mating connector to fix the second mating connector at a suitable position on the guide rail.

* * * * *